(12) United States Patent
Chen et al.

(10) Patent No.: US 10,251,264 B2
(45) Date of Patent: Apr. 2, 2019

(54) MEMBRANE CIRCUIT STRUCTURE WITH FUNCTION EXPANDABILITY

(71) Applicant: Primax Electronics Ltd., Taipei (TW)

(72) Inventors: Bo-An Chen, Taipei (TW); Hsien-Tsan Chang, Taipei (TW)

(73) Assignee: PRIMAX ELECTRONICS LTD., Taipei (TW)

(*) Notice: Subject to any disclaimer, the term of this patent is extended or adjusted under 35 U.S.C. 154(b) by 0 days.

(21) Appl. No.: 15/655,286

(22) Filed: Jul. 20, 2017

(65) Prior Publication Data

US 2018/0279470 A1 Sep. 27, 2018

(30) Foreign Application Priority Data

Mar. 24, 2017 (TW) .............................. 106109929 A

(51) Int. Cl.
| | |
|---|---|
| H05K 1/11 | (2006.01) |
| H05K 1/02 | (2006.01) |
| H05K 1/03 | (2006.01) |
| H05K 1/09 | (2006.01) |
| H05K 1/18 | (2006.01) |
| H05K 3/24 | (2006.01) |
| H05K 3/18 | (2006.01) |
| C25D 17/00 | (2006.01) |
| C25D 5/00 | (2006.01) |

(52) U.S. Cl.
CPC ......... *H05K 1/0298* (2013.01); *C25D 17/002* (2013.01); *H05K 1/0277* (2013.01); *H05K 1/0393* (2013.01); *H05K 1/09* (2013.01); *H05K 1/11* (2013.01); *H05K 1/189* (2013.01); *H05K 3/188* (2013.01); *H05K 3/243* (2013.01); *C25D 5/00* (2013.01)

(58) Field of Classification Search
None
See application file for complete search history.

(56) References Cited

U.S. PATENT DOCUMENTS

| | | | | |
|---|---|---|---|---|
| 4,081,601 A | * | 3/1978 | Dinella | B23K 35/007 174/257 |
| 4,314,117 A | * | 2/1982 | Ditzig | H01H 1/06 200/275 |
| 4,609,792 A | * | 9/1986 | Levasseur | H01H 13/702 200/5 A |
| 4,916,275 A | * | 4/1990 | Almond | H01H 13/7006 200/5 A |

(Continued)

*Primary Examiner* — Xanthia C Cunningham
(74) *Attorney, Agent, or Firm* — Muncy, Geissler, Olds & Lowe, P.C.

(57) ABSTRACT

A membrane circuit structure with function expandability is provided. The membrane circuit structure includes a substrate, a lower circuit layer and a covering layer. The substrate includes a first region and at least one second region. The at least one second region is arranged near the first region. The lower circuit layer is printed on the first region. The lower circuit layer is made of a first conductive material. The covering layer is electroplated on a portion of a surface of the lower circuit layer. The covering layer is made of a second conductive material. At least one expansion line is welded on the corresponding second region, and electrically connected with the covering layer and a corresponding function-expanding unit.

10 Claims, 3 Drawing Sheets

(56) References Cited

U.S. PATENT DOCUMENTS

| | | | | |
|---|---|---|---|---|
| 5,294,762 A * | 3/1994 | Kaizu | H01H 13/7006 | 200/310 |
| 5,357,065 A * | 10/1994 | Mitamura | H01H 13/7006 | 200/5 A |
| 5,512,721 A * | 4/1996 | Young | H01H 13/7006 | 200/308 |
| 5,561,278 A * | 10/1996 | Rutten | H01H 13/702 | 200/5 A |
| 5,670,760 A * | 9/1997 | Christy | H01H 13/702 | 200/5 A |
| 6,028,278 A * | 2/2000 | Fluman | H01H 1/20 | 200/512 |
| 6,041,495 A * | 3/2000 | Yoon | H01L 23/3107 | 257/E23.063 |
| 7,092,520 B2 * | 8/2006 | Fuhrmann | H04M 1/0252 | 361/679.56 |
| 7,316,789 B2 * | 1/2008 | Lu | B82Y 30/00 | 252/299.01 |
| 9,883,583 B2 * | 1/2018 | Cousins | H05K 1/028 | |
| 2006/0283698 A1 * | 12/2006 | Huang | G06F 3/0202 | 200/310 |
| 2007/0012555 A1 * | 1/2007 | Fuchigami | H01H 13/703 | 200/512 |
| 2007/0037379 A1 * | 2/2007 | Enquist | H01L 21/76898 | 438/618 |
| 2008/0036003 A1 * | 2/2008 | Lin | H01H 13/83 | 257/355 |
| 2008/0230362 A1 * | 9/2008 | Hsu | H01H 13/705 | 200/512 |
| 2009/0256817 A1 * | 10/2009 | Perlin | G06F 3/0233 | 345/174 |
| 2011/0073458 A1 * | 3/2011 | Han | H01H 13/702 | 200/5 A |
| 2011/0186334 A1 * | 8/2011 | Humphries | B23K 1/20 | 174/251 |
| 2012/0318656 A1 * | 12/2012 | Chen | H01H 13/83 | 200/517 |
| 2013/0199911 A1 * | 8/2013 | Sato | H01H 13/83 | 200/5 A |
| 2013/0240256 A1 * | 9/2013 | Von Werne | H05K 3/282 | 174/257 |
| 2014/0138227 A1 * | 5/2014 | Chen | H01H 13/83 | 200/5 A |
| 2014/0168935 A1 * | 6/2014 | Chen | G02B 6/0083 | 362/23.03 |
| 2014/0339066 A1 * | 11/2014 | Liang | H03K 17/975 | 200/600 |
| 2015/0311012 A1 * | 10/2015 | Wada | H01L 41/1132 | 200/514 |
| 2016/0066419 A1 * | 3/2016 | Kamei | H05K 1/0393 | 174/254 |

\* cited by examiner

MEMBRANE CIRCUIT STRUCTURE WITH FUNCTION EXPANDABILITY

FIELD OF THE INVENTION

The present invention relates to a membrane circuit structure with function expandability, and more particularly to a membrane circuit structure comprising an electroplated structure on a circuit layer in order to reduce the impedance value.

BACKGROUND OF THE INVENTION

As known, an electronic device or an operation device is usually equipped with an operation interface or a key control panel. Recently, in order to integrate the operation interface or the key control panel with the device, prevent damage and achieve the decorative benefit, the operation interface or the key control panel is designed toward miniaturization. Although the use of conventional printed circuit board (PCB) can function well, there are still some drawbacks. For example, the rigidity, hardness and thickness of the printed circuit board are relatively higher. Consequently, the use of the printed circuit board cannot comply with the miniaturization requirement. Moreover, the printed circuit board cannot be applied to various curvy surfaces. For solving the above drawbacks, a membrane circuit structure or a membrane switch structure has been widely used in the industry.

Nowadays, various membrane technologies have been disclosed. In accordance with one of the widely-used membrane technologies, a substrate of a membrane circuit board is made of polyester material such as polyethylene terephthalate (PET). Due to the insulating property, the heat resistance, the flexibility and the high resilience, the membrane circuit board formed of the PET membrane is softly or flexibly bendable. That is, the characteristics of the membrane circuit board are similar to the well-known flexible printed circuit (FPC). Moreover, after the polyester substrate of the membrane circuit board is printed with conductive silver paste, a designated circuit pattern is formed. The membrane circuit board is electrically conducted through the circuit pattern.

Depending on the applied devices, the operation interfaces or the key control panels with the membrane switch structure have many types. For example, a keyboard is equipped with a great number of keys. Consequently, the inner circuitries are very complicated. Generally, the layout area of the substrate is limited. For connecting the circuit pattern to the designated position, the path of the trace layout is usually very long. In addition to the keys, the keyboard also comprises luminous indication elements or backlight elements according to the practical requirements.

In case that an upper circuit layer and a lower circuit layer of the membrane circuit board are connected with each other in a bridging connection manner, the more complicated circuit structure can be obtained. Likewise, the upper circuit layer and the lower circuit layer are printed with conductive silver paste. Moreover, an insulating separation layer is arranged between the upper circuit layer and the lower circuit layer for separating the upper circuit layer and the lower circuit layer. The insulating separation layer has a perforation. A jumper is penetrated through the perforation to electrically connect the upper circuit layer and the lower circuit layer. Moreover, the membrane switch structure further comprises a panel layer and an adhesive layer. The panel layer is used as the operation panel. The adhesive layer is used for combining associated layers together. In other words, the membrane circuit structure is a multi-layered flat circuit board that is composed of elastic conductive material and insulating material.

Generally, as the length of the trace layout is increased, the impedance value is increased and the performance of the applied device is deteriorated. For example, in case that the key is located at a farther position, the response time of depressing the key is longer. Especially when the key is located at the bridging joint (i.e., the jumper), the impedance difference becomes larger. In case that a LED unit is located at the distal position of a LED strip, the power and brightness are lower than the LED units at other positions.

Conventionally, the impedance value of the circuit pattern is adjusted according to the thickness of the circuit pattern, the composition of the silver paste and silver fraction of the silver paste. However, the efficacy of adjusting the impedance value by the conventional method is limited. For example, the impedance value of the LED strip is adjusted to be about 120±30 ohms (a). However, the reduction of the impedance value is still unsatisfied.

SUMMARY OF THE INVENTION

The present invention provides a membrane circuit structure with function expandability. An electroplated structure made of another conductive material is formed on a circuit layer. Consequently, the impedance value is effectively reduced and the overall conductivity is enhanced. Under this circumstance, the circuit layer can be expanded or electrically connected with other function-expanding units In accordance with an aspect of the present invention, there is provided a membrane circuit structure with function expandability. The membrane circuit structure includes a substrate, a lower circuit layer and a covering layer. The substrate includes a first region and at least one second region. The at least one second region is arranged near the first region. The lower circuit layer is printed on the first region. The lower circuit layer is made of a first conductive material. The covering layer is electroplated on a portion of a surface of the lower circuit layer. The covering layer is made of a second conductive material. At least one expansion line is welded on the corresponding second region, and electrically connected with the covering layer and a corresponding function-expanding unit.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. In the following embodiments and drawings, the elements irrelevant to the concepts of the present invention are omitted and not shown.

Figure 1:
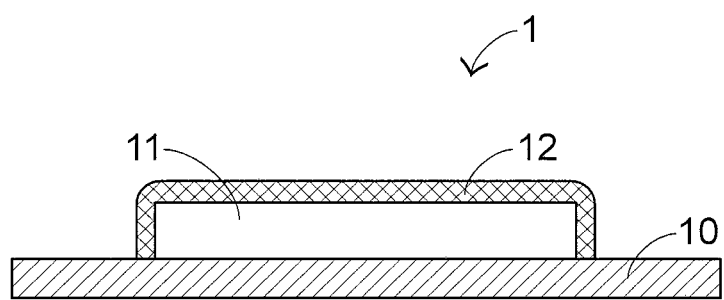
FIG. 1 is a schematic cross-sectional view illustrating a membrane circuit structure according to a first embodiment of the present invention.
Figure 2:
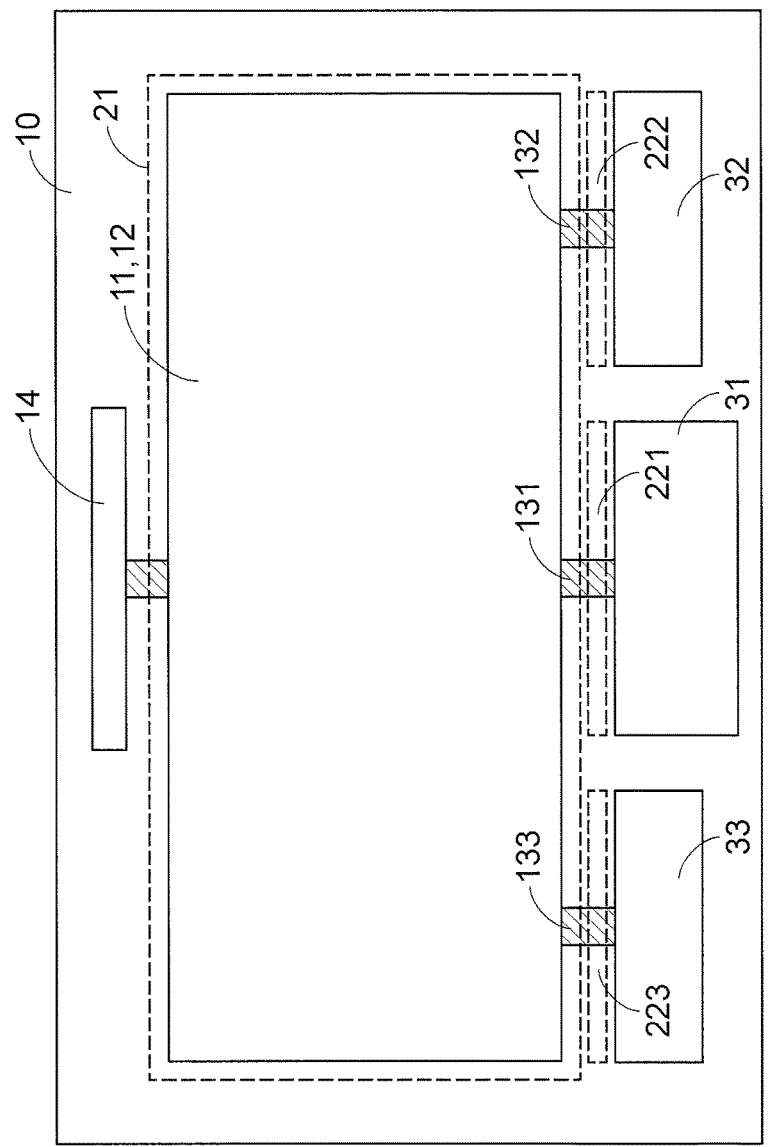
FIG. 2 is a schematic top view illustrating a keyboard module with the membrane circuit structure according to the first embodiment of the present invention.

Hereinafter, an example of a membrane circuit structure will be illustrated with reference to FIGS. 1 and 2. FIG. 1 is a schematic cross-sectional view illustrating a membrane circuit structure according to a first embodiment of the present invention. FIG. 2 is a schematic top view illustrating a keyboard module with the membrane circuit structure according to the first embodiment of the present invention. In this embodiment, the membrane circuit structure 1 has a single circuit layer. For example, the single circuit layer is formed on the bottom side of the membrane circuit structure 1. It is noted that the concepts of the present invention are not restricted. For example, in another embodiment, the membrane circuit structure comprises multiple circuit layers. Alternatively, the membrane circuit structure has the general structure with an upper circuit layer and a lower circuit layer.

As shown in FIG. 1, the membrane circuit structure 1 comprises a substrate 10, a lower circuit layer 11 and a covering layer 12. In an embodiment, the substrate 10 is made of soft polyester material such as polyethylene terephthalate (PET). The lower circuit layer 11 is made of a first conductive material such as conductive silver paste. The covering layer 12 is made of a second conductive material. The second conductive material is a conductive metallic material such as copper. The lower circuit layer 11 has a designated circuit pattern that is printed on a surface of the substrate 10. The covering layer 12 is an electroplated structure that is formed on the lower circuit layer 11.

As mentioned above, the lower circuit layer 11 is made of conductive silver paste (i.e., the first conductive material), and the covering layer 12 is made of copper (i.e., the second conductive material). Moreover, the covering layer 12 is formed over the lower circuit layer 11. Since the covering layer 12 and the lower circuit layer 11 are in contact with each other, the covering layer 12 and the lower circuit layer 11 interact with each other. For example, the gaps between adjacent silver molecules of the conductive silver paste of the lower circuit layer 11 are filled due to the electrical conductivity of the second conductive material (i.e., copper). Therefore, the electrical conductivity of the lower circuit layer 11 (i.e., the conductive silver paste) is enhanced. In other words, the region of the lower circuit layer 11 covered by the covering layer 12 has a reduced impedance value.

As previously described, the efficacy of adjusting the impedance value of the circuit pattern according to the conventional trace layout is limited. According to the present invention, the electroplated structure (i.e., copper) formed on the circuit pattern is effective to overcome the drawbacks of the conventional technologies. In accordance with a feature of the present invention, the covering layer 12 is partially formed on an exposed surface of the lower circuit layer 11. This feature is not shown in FIG. 1. The lower circuit layer 11 is not completely covered by the covering layer 12. Especially, the covering layer 12 is formed on the designated region of the lower circuit layer 11 that requires a low impedance value. The other region of the lower circuit layer 11 which does not require the low impedance value is printed with the conductive silver paste only. That is, the region of the lower circuit layer 11 not requiring the low impedance value is not covered by the covering layer 12.

As shown in FIG. 1, the lateral surfaces and the top surface of the lower circuit layer 11 are covered by the covering layer 12. Consequently, the impedance value of the contact region between the lower circuit layer 11 and the covering layer 12 is lower than the impedance value of the non-contact region between the lower circuit layer 11 and the covering layer 12. Due to the low impedance value of the contact region between the lower circuit layer 11 and the covering layer 12, an expandable circuit pattern can be provided. Moreover, since the covering layer 12 is the electroplated structure (i.e., copper), the expandable circuit pattern on the covering layer 12 can be easily produced by a welding process (e.g., a low temperature welding process).

Moreover, the membrane circuit structure 1 is installed in a keyboard module. For succinctness, the keys of the keyboard module are not shown in FIG. 2. The keys are collaboratively defined as an operation interface panel layer. The operation interface panel layer is attached on the lower circuit layer 11 or the covering layer 12. In case that the membrane circuit structure 1 has the single circuit layer, the operation interface panel layer is attached on the lower circuit layer 11. As shown in FIG. 2, the surface of the substrate 10 for printing the lower circuit layer 11 comprises a first region 21 and plural second regions 221, 222 and 223. These second regions 221, 222 and 223 are arranged near the first region 21. The lower circuit layer 11 is formed on the first region 21. Especially, the size of the lower circuit layer 11 is equal to the size of the first region 21.

For succinctness, the covering layer 12 is not shown in FIG. 2. It is noted that the covering layer 12 is formed on a portion of the lower circuit layer 11. That is, the distribution area of the covering layer 12 is not larger than the first region 21. In FIG. 2, three second regions 221, 222 and 223 are shown. It is noted that the number of the second regions is not restricted. The number of the second regions is determined according to the practical requirements (e.g., the size and number of the expanded components). For example, the substrate 10 may comprise one, two, three or more than three second regions. Since the membrane circuit structure 1 is applied to the keyboard module, the first region 21 takes a greater portion of the substrate 10.

As mentioned above, the membrane circuit structure 1 is applied to the keyboard module. Moreover, the keyboard module may be combined with any other appropriate function module. For example, a backlight module with a LED strip can be used as the function module. The backlight module can be used as a light source for all keys or used as light sources for respective keys. Consequently, the keyboard module and the backlight module are combined as a backlight keyboard.

The keyboard module with the membrane circuit structure 1 (i.e., a membrane keyboard) is a keyboard module of a general notebook computer or an expandable keyboard of a tablet computer. For applying the membrane circuit structure 1 to the keyboard module of the notebook computer or the expandable keyboard of the tablet computer, the thicknesses and sizes of the membrane circuit structure 1 and its hardware components are specially designed to meet the slimness requirement. Moreover, in response to the keys, the keyboard module may further comprise other function units.

Moreover, plural expansion lines 131, 132 and 133 are respectively formed on the second regions 221, 222 and 223 and electrically connected with the covering layer 12 by a welding process. Moreover, the expansion lines 131, 132 and 133 are electrically connected with the corresponding function-expanding units 31, 32 and 33. An example of the function-expanding unit includes but is not limited to an antenna, a charging circuit, a touch interface, a fingerprint recognition module or a sound output module (e.g., a loudspeaker).

Please refer to FIG. 2 again. The function-expanding unit 31 electrically connected with the middle expansion line 131 is a touch interface. The touch interface is arranged beside the second region 221. The function-expanding unit 32 electrically connected with the right expansion line 132 is a sound output module (e.g., a right loudspeaker). The function-expanding unit 33 electrically connected with the left expansion line 133 is also a sound output module (e.g., a left loudspeaker). The right loudspeaker is arranged beside the second region 222. The left loudspeaker is arranged beside the second region 223.

As mentioned above, the expansion lines 131, 132 and 133 are short. The function-expanding units 31, 32 and 33 are electrically connected with the covering layer 12 through the expansion lines 131, 132 and 133. Since the lower circuit layer 11 or the covering layer 12 is designed according to the standard keypad arrangement, the first region 21 is relatively larger. That is, the length or the width of the first region 21 is larger. Consequently, even if the paths of the expansion lines 132 and 133 corresponding to the function-expanding units 32 and 33 (i.e., the right and left loudspeakers) are not long, the electrical connection can be established.

Since the covering layer 12 has the low impedance value, the periphery of the covering layer 12 can be electrically connected with the desired function-expanding units. Under this circumstance, the circuits of the keyboard module can be integrated with each other. In the above embodiment, the second regions 221, 222 and 223 are arranged near a specified side of the first region 21. It is noted that the concepts of the present invention are not restricted. For example, the second regions can be arranged near other sides of the first region 21.

As mentioned above, the keyboard module with the membrane circuit structure 1 (i.e., a membrane keyboard) is a keyboard module of a general notebook computer or an expandable keyboard of a tablet computer. The membrane circuit structure 1 further comprises a transmission interface 14. The transmission interface 14 is used for transmitting signals between the membrane circuit structure 1 and the applied electronic device (e.g., the notebook computer or the tablet computer). As shown in FIG. 2, the transmission interface 14 is arranged near the first region 21 and electrically connected with the lower circuit layer 11. Moreover, the in FIG. 2, the transmission interface 14 is opposite to the second regions 221, 222 and 223 with respect to the first region 21. In this embodiment, the portion of the lower circuit layer 11 electrically connected with the transmission interface 14 is not covered by the covering layer 12.

In the embodiment of FIG. 2, the transmission interface 14 and the function-expanding units 31, 32 and 33 are disposed on the substrate 10. It is noted that the concepts of the present invention are not restricted. For example, in another embodiment, the transmission interface 14 and the function-expanding units 31, 32 and 33 are not disposed on the substrate 10. For example, the transmission interface 14 and the function-expanding units 31, 32 and 33 are disposed on a case of the keyboard module and separated from the substrate 10. Under this circumstance, the expansion lines 131, 132 and 133 are connected with the function-expanding units 31, 32 and 33 through flexible flat cables or flexible printed circuits (FPCs). Generally, the transmission interface 14 for the membrane circuit structure or the membrane switch structure is connected with an outlet line.

It is noted that numerous modifications and alterations may be made while retaining the teachings of the invention. In another embodiment, the membrane circuit structure is a two-layered flat circuit board composed of an upper circuit layer and a lower circuit layer. Generally, the process of designing the single-layered circuit board with the lower circuit layer is more difficult than process of designing the multi-layered circuit board except that the trace layout is simple or not dense or the longer path of the trace layout is acceptable. Consequently, the way of connecting the upper circuit layer and the lower circuit layer with a jumper can reduce the designing complexity.

Figure 3:
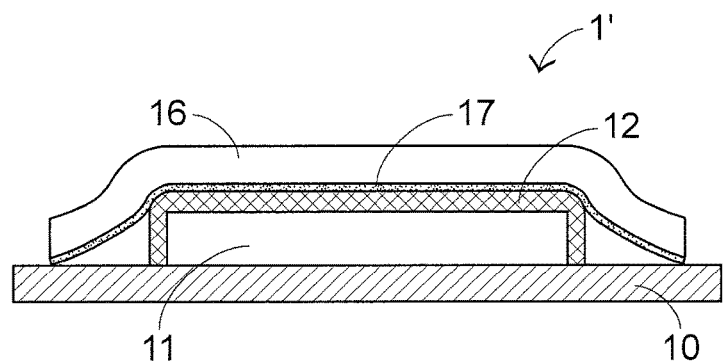
FIG. 3 is a schematic cross-sectional view illustrating a membrane circuit structure according to a second embodiment of the present invention.

FIG. 3 is a schematic cross-sectional view illustrating a membrane circuit structure according to a second embodiment of the present invention. Similarly, the membrane circuit structure 1' comprises a lower circuit layer 11 and a covering layer 12. In comparison with the first embodiment, the membrane circuit structure 1' further comprises an insulating separation layer 17 and an upper circuit layer 16. The insulating separation layer 17 is formed over the covering layer 12 and the lower circuit layer 11. The upper circuit layer 16 is formed over the insulating separation layer 17. In other words, the membrane circuit structure 1' is a two-layered flat circuit board.

As mentioned in the first embodiment, the covering layer 12 is partially formed on an exposed surface of the lower circuit layer 11. For separating the upper circuit layer 16 from the lower circuit layer 11, the insulating separation layer 17 is formed over the covering layer 12 and the uncovered portion of the lower circuit layer 11. Similarly, the upper circuit layer 16 is made of the conductive silver paste (i.e., the first conductive material). The upper circuit layer 16 and the lower circuit layer 11 are formed according to the required trace layout.

Figure 4:
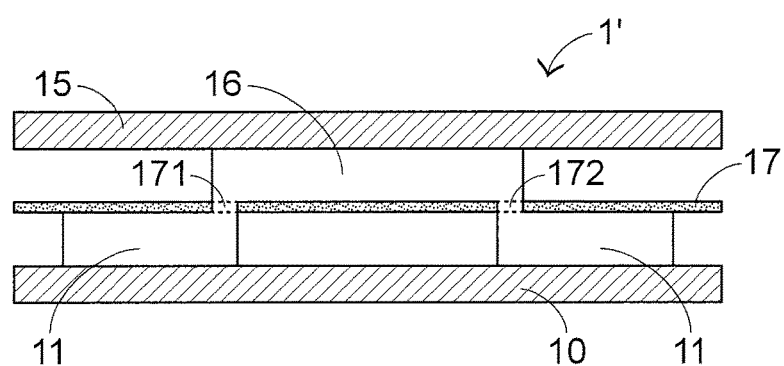
FIG. 4 is a schematic cross-sectional view illustrating the connection between the upper circuit layer and the lower circuit layer of the membrane circuit structure of FIG. 3.

FIG. 4 is a schematic cross-sectional view illustrating the connection between the upper circuit layer and the lower circuit layer of the membrane circuit structure of FIG. 3. As shown in FIG. 4, the membrane circuit structure 1' further comprises an additional substrate 15. The upper circuit layer 16 is printed on the additional substrate 15. The assembly of the upper circuit layer 16 and the additional substrate 15 and the assembly of the lower circuit layer 11 and the substrate 10 are individually produced and then combined together. As shown in FIG. 4, the insulating separation layer 17 further comprises plural perforations 171 and 172. The upper circuit layer 16 and the lower circuit layer 11 are electrically connected with each other through the perforations 171 and 172.

In FIG. 4, the portion of the lower circuit layer 11 uncovered by the covering layer 12 is shown. In case that the junction between the upper circuit layer 16 and the lower circuit layer 11 is aligned with the covering layer 12, the covering layer 12 also comprises plural perforations (not shown) corresponding to the perforations of the insulating separation layer 17. The upper circuit layer 16 and the lower circuit layer 11 are electrically connected with each other through the perforations of the covering layer 12 and the perforations of the insulating separation layer 17. The number of the perforations is determined according to the circuit patterns of the upper circuit layer 16 and the lower circuit layer 11. The number of the perforations is at least 1. In case that the two-layered configuration needs more bridging connection parts, the number of the perforations is increased.

The substrate 10, the insulating separation layer 17 and the substrate 15 are attached on each other. Moreover, the upper circuit layer 16 and the lower circuit layer 11 comprise contact points (not shown) corresponding to the plural perforations 171 and 172 of the insulating separation layer 17. The contact points of the upper circuit layer 16 are vertically aligned with the corresponding contact points of the lower circuit layer 11. In an embodiment, the upper circuit layer 16 and the lower circuit layer 11 are contacted and electrically connected with each other by a laminating process. After the laminating process is completed, the contact points of the upper circuit layer 16 and the corresponding contact points of the lower circuit layer 11 are contacted and electrically connected with each other through the perforations 171 and 172. Alternatively, in another embodiment, the upper circuit layer 16 and the lower circuit layer 11 are electrically connected with each other through conductor lines (not shown) in the perforations.

From the above descriptions, the membrane circuit structure of the present invention is capable of transmitting signal through the shortest trace path and fully utilizing the layout space to complete the designated trace layout. Since the electroplated structure is formed on the circuit layer, the impedance value is effectively reduced and the overall conductivity is enhanced. Consequently, the circuit layer can be expanded or electrically connected with other function-expanding units.

When the other function-expanding units need to be integrated or installed in an electronic device, the original circuit pattern on the main substrate can be electrically connected with the function-expanding units. Under this circumstance, the path of the trace layout is shortened or the layout area of the substrate is saved. Consequently, the complexity of designing the trace layout is reduced, and the fabricating cost is saved. In other words, the membrane circuit structure can effectively overcome the drawbacks of the conventional technologies.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A membrane circuit structure with function expandability, the membrane circuit structure comprising:
   a substrate comprising a first region and at least one second region, wherein the at least one second region is arranged near the first region;
   a lower circuit layer printed on the first region, wherein the lower circuit layer is made of a first conductive material; and
   a covering layer electroplated on a portion of a surface of the lower circuit layer, wherein the covering layer is made of a second conductive material and in contact with the lower circuit layer so as to enhance the electrical conductivity of the lower circuit layer,
   wherein at least one expansion line is welded on the corresponding second region, and electrically connected with the covering layer and a corresponding function-expanding unit.

2. The membrane circuit structure according to claim 1, wherein the substrate is made of polyester, and the membrane circuit structure is installed in a keyboard module.

3. The membrane circuit structure according to claim 1, wherein the first conductive material is conductive silver paste, and the second conductive material is a conductive metallic material.

4. The membrane circuit structure according to claim 1, further comprising:
   an insulating separation layer formed over the covering layer and the lower circuit layer; and
   an upper circuit layer formed on the insulating separation layer, wherein the upper circuit layer is made of the first conductive material,
   wherein the insulating separation layer comprises at least one perforation, and the upper circuit layer and the lower circuit layer are electrically connected with each other through the at least one perforation.

5. The membrane circuit structure according to claim 4, wherein the membrane circuit structure further comprises an additional substrate, and the upper circuit layer is printed on the additional substrate, wherein the substrate, the insulating separation layer and the additional substrate are attached on each other.

6. The membrane circuit structure according to claim 4, wherein the upper circuit layer and the lower circuit layer are electrically connected with each other through at least one conductor line in the at least one perforation, or the upper circuit layer and the lower circuit layer are contacted and electrically connected with each other through the at least one perforation by a laminating process.

7. The membrane circuit structure according to claim 1, wherein the function-expanding unit is an antenna, a charging circuit, a touch interface, a fingerprint recognition module or a sound output module.

8. The membrane circuit structure according to claim 1, wherein an impedance value of a contact region between the lower circuit layer and the covering layer is lower than an impedance value of a non-contact region between the lower circuit layer and the covering layer.

9. The membrane circuit structure according to claim 1, further comprising a transmission interface, wherein the transmission interface is electrically connected with the lower circuit layer, the membrane circuit structure is applied to an electronic device, and the transmission interface is used for transmitting signals between the membrane circuit structure and the applied electronic device.

10. The membrane circuit structure according to claim 9, wherein the transmission interface is arranged near the first region.

* * * * *